US008111791B2

United States Patent
Sturza

(10) Patent No.: US 8,111,791 B2
(45) Date of Patent: Feb. 7, 2012

(54) DIFFERENTIAL EVOLUTION DESIGN OF POLYPHASE IIR DECIMATION FILTERS

(75) Inventor: Mark Alan Sturza, Encino, CA (US)

(73) Assignee: SiRF Technology, Inc., San Jose, CA (US)

(*) Notice: Subject to any disclaimer, the term of this patent is extended or adjusted under 35 U.S.C. 154(b) by 875 days.

(21) Appl. No.: 11/614,001

(22) Filed: Dec. 20, 2006

(65) Prior Publication Data

US 2007/0153946 A1    Jul. 5, 2007

Related U.S. Application Data

(60) Provisional application No. 60/752,619, filed on Dec. 20, 2005.

(51) Int. Cl.
 *H04B 1/10* (2006.01)
(52) U.S. Cl. .................... 375/350; 375/346; 455/307
(58) Field of Classification Search .......... 375/346, 375/350; 455/307; 708/300
See application file for complete search history.

(56) References Cited

U.S. PATENT DOCUMENTS

| | | | |
|---|---|---|---|
| 5,852,681 A * | 12/1998 | Amaratunga et al. | 382/268 |
| 5,877,971 A * | 3/1999 | Eastty et al. | 708/305 |
| 6,237,016 B1 * | 5/2001 | Fischer et al. | 708/622 |
| 6,411,892 B1 | 6/2002 | Van Diggelen | |
| 6,417,801 B1 | 7/2002 | Van Diggelen | |
| 6,429,814 B1 | 8/2002 | Van Diggelen et al. | |
| 6,453,237 B1 | 9/2002 | Fuchs et al. | |
| 6,484,097 B2 | 11/2002 | Fuchs et al. | |
| 6,487,499 B1 | 11/2002 | Fuchs et al. | |
| 6,510,387 B2 | 1/2003 | Van Diggelen et al. | |
| 6,542,820 B2 | 4/2003 | LaMance et al. | |
| 6,560,534 B2 | 5/2003 | Abraham et al. | |
| 6,606,346 B2 | 8/2003 | Abraham et al. | |
| 6,704,651 B2 | 3/2004 | Van Diggelen | |
| 2003/0074381 A1 * | 4/2003 | Awad et al. | 708/322 |
| 2004/0071206 A1 * | 4/2004 | Takatsu | 375/232 |
| 2004/0146205 A1 * | 7/2004 | Becker et al. | 382/232 |
| 2004/0190660 A1 * | 9/2004 | Morris et al. | 375/350 |
| 2006/0056640 A1 * | 3/2006 | Barnhill | 381/23 |
| 2006/0083296 A1 * | 4/2006 | Bhattacharjee et al. | 375/232 |
| 2006/0181644 A1 * | 8/2006 | De Haan | 348/458 |
| 2008/0256160 A1 * | 10/2008 | Lusk et al. | 708/405 |

\* cited by examiner

*Primary Examiner* — David C. Payne
*Assistant Examiner* — Erin File
(74) *Attorney, Agent, or Firm* — K&L Gates LLP

(57) ABSTRACT

A method for designing a digital filter, includes: (a) selecting a predetermined number of current sets of coefficients for the digital filter; (b) selecting a metric for evaluating coefficients of the digital filter; (c) computing a metric for each current set of coefficients; (d) deriving a next set of coefficients based on a subset of the current set of coefficients; (e) computing the metric for the next set of coefficients; (f) replacing a selected one of the current set of coefficients based on comparing the metric for the next set of coefficients with the metric for the selected current set of coefficients; and (g) iterating steps (a) to (e) until a termination criterion is met. In one embodiment, the selected metric represents a desired stop band response. The next set of coefficients may be derived by adjusting a first current set of coefficients by a weighted difference between a second current set of coefficients and a third current set of coefficients. The weighted difference may be obtained by multiplying a predetermined factor to the difference between the second current set of coefficients and the third current set of coefficients. In one embodiment, a scaling is performed such that the next set of coefficients does not include a pole outside of the unit circle.

25 Claims, 3 Drawing Sheets

DIFFERENTIAL EVOLUTION DESIGN OF POLYPHASE IIR DECIMATION FILTERS

CROSS-REFERENCE TO RELATED APPLICATIONS

The present application is related to and claims benefit of priority of U.S. Provisional Patent Application ("Provisional Application"), entitled "Differential Evolution Design of Polyphase IIR Decimation Filters," Ser. No. 60/752,619, filed on Dec. 20, 2005. The Provisional Application is hereby incorporated by reference in its entirety.

BACKGROUND OF THE INVENTION

1. Field of the Invention

The present invention relates to the design of an M-path, polyphase IIR decimate-by-M filter.

2. Description of the Related Art

Digital M-path, polyphase infinite impulse response (IIR) filters may be used as decimators (interpolators) with a decimation (interpolation) ratio M, for M greater than one. Such filters are based on the M-tap finite impulse response (FIR) filter, in which the coefficients are replaced by allpass filters. Polyphase IIR filters provide high stop band attenuation and low pass band ripple, even with a relatively small number of coefficients.

FIG. 1 shows an example of an M-path, polyphase IIR decimate-by-M filter structure 100. As shown in FIG. 1, filter 100 receives input samples x(n), which are provided to an M-1 stage tapped delay line. Input sample x(n) and the output samples of the M-1 delay line taps are down-sampled by a factor of M (steps 101-0 to 101-($m$-1)). Each of the M down-sampled values are provided as input to a corresponding one of M allpass filters 102-0 to 102-($m$-1). The filtered output values are summed at summer 103; thereafter, the sum is scaled by 1/M to form the output sample y(m). The transfer function of M-path, polyphase IIR decimator 100 is given by:

$$H(z) = \frac{1}{M}\sum_{k=0}^{M} z^{-k} A_k(z^M)$$

Assuming that each of the M allpass filters 102-0 to 102-(M-1) has N real sections (i.e. N coefficients), the transfer functions of the allpass filters 102-0 to 102-(M-1) have the form:

$$A_k(z) = \prod_{j=1}^{N} \frac{\beta_{k,j} + z^{-1}}{1 + \beta_{k,j} z^{-1}}$$

Substituting the allpass filter transfer functions into the transfer function of M-path, polyphase IIR decimator 100 then gives:

$$H(z) = \frac{1}{M}\sum_{k=0}^{M} z^{-k} \prod_{j=1}^{N} \frac{\beta_{k,j} + z^{-M}}{1 + \beta_{k,j} z^{-M}}$$

Thus, the total number of filter coefficients is M×N.

SUMMARY

According to one embodiment of the present invention, a method for designing a digital filter, includes: (a) selecting a predetermined number of current sets of coefficients for the digital filter; (b) selecting a metric for evaluating coefficients of the digital filter; (c) computing a metric for each current set of coefficients; (d) deriving a next set of coefficients based on a subset of the current set of coefficients; (e) computing the metric for the next set of coefficients; (f) replacing a selected one of the current set of coefficients based on comparing the metric for the next set of coefficients with the metric for the selected current set of coefficients; and (g) iterating steps (a) to (e) until a termination criterion is met.

In one embodiment, the selected metric represents a desired stop band response. The next set of coefficients may be derived by adjusting a first current set of coefficients by a weighted difference between a second current set of coefficients and a third current set of coefficients. The weighted difference may be obtained by multiplying a predetermined factor to the difference between the second current set of coefficients and the third current set of coefficients.

In one embodiment, a scaling is performed such that the next set of coefficients does not include a pole outside of the unit circle.

The present invention is better understood upon consideration of the detailed description below, in conjunction with the accompanying drawings.

DETAILED DESCRIPTION OF THE PREFERRED EMBODIMENTS

Figure 1:
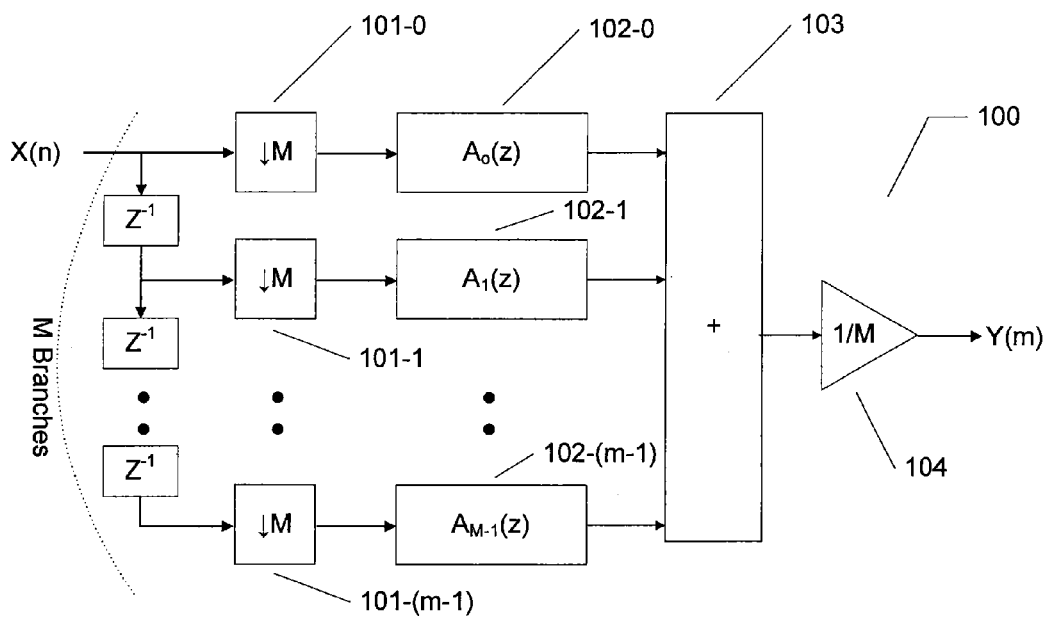
FIG. 1 shows an example of a conventional M-path, polyphase IIR decimate-by-M filter structure 100.
Figure 2:
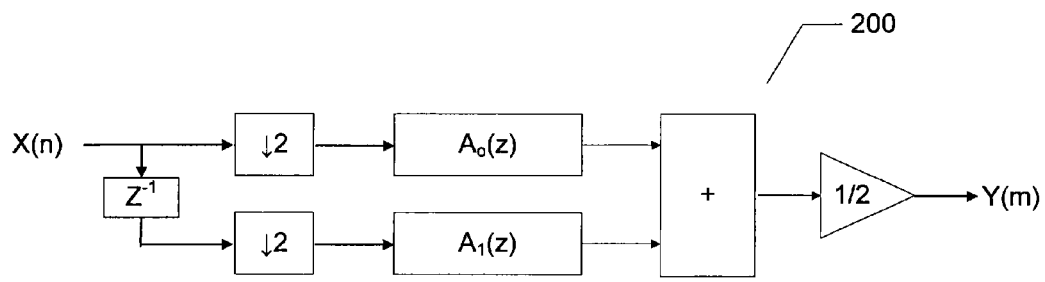
FIG. 2 shows an example of 2-path, decimate-by-2 structure 200, in accordance with one embodiment of the present invention.
Figure 3:
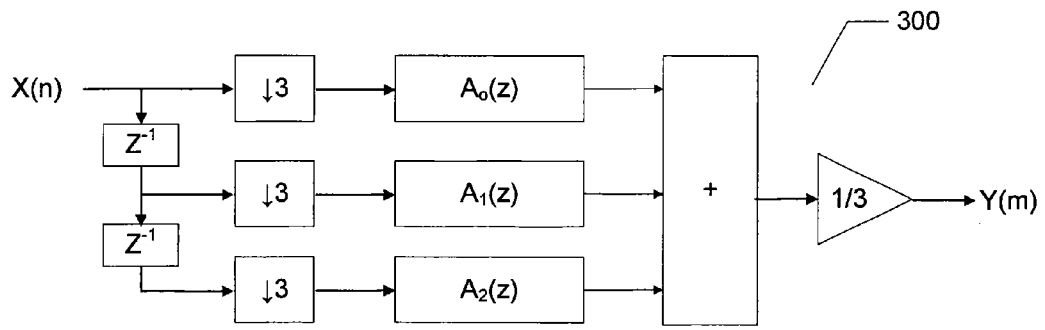
FIG. 3 shows an example of 3-path, decimate-by-3-structure 300, in accordance with one embodiment of the present invention.
Figure 4:
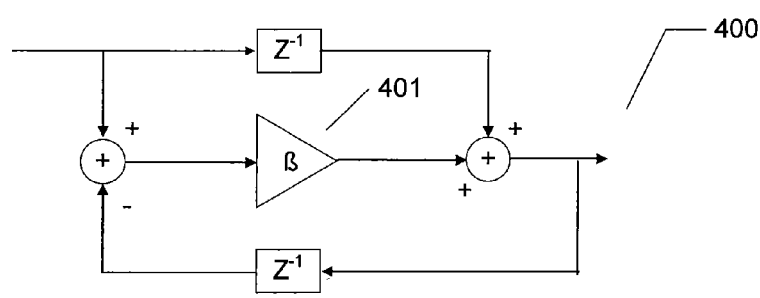
FIG. 4 shows structure 400 of a single real section (single coefficient) of an allpass filter.

FIG. 2 shows an example of 2-path, decimate-by-2 structure 200, and FIG. 3 shows an example of a specific 3-path, decimate-by-3-structure 300. FIG. 4 shows structure 400 of a single real section (i.e., single-coefficient) of an allpass filter. As shown in FIG. 4, input value x(n) is subtracted the output value of scale-by-beta amplifier 401, delayed by one unit. The difference is provided to scale-by-beta amplifier 401. The output value of scale-by-beta amplifier 401 is added to the input value x(n), delayed by one unit to form the filter output. As shown in FIG. 4, structure 400 has the transfer function:

$$H(z) = \frac{\beta + z^{-1}}{1 + \beta z^{-1}}$$

Figure 5:
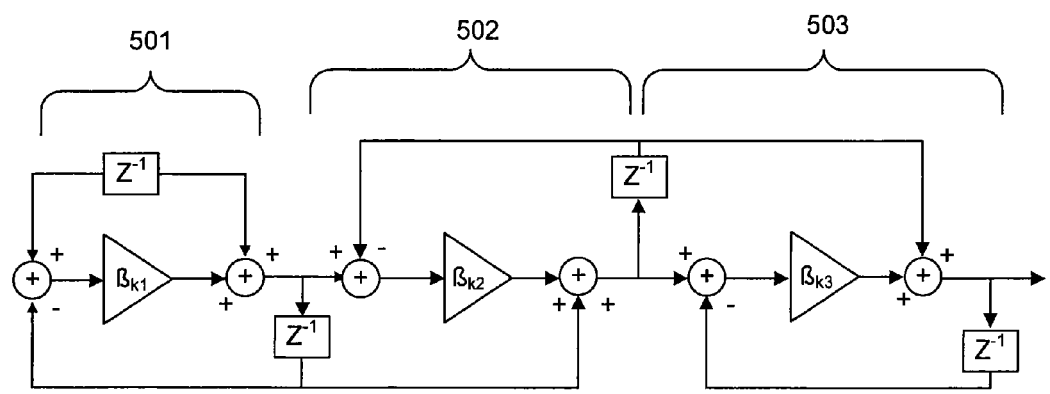
FIG. 5 shows cascading three real sections 501, 502 and 503 to form a 3-coefficient filter, in which delay elements are shared between stages.

FIG. 5 shows cascading three real sections 501, 502 and 503 to form a 3-coefficient filter, in which delay elements are shared between stages.

Lutovac and Milic[1] and Krukowski and Kale[2] are textbooks that provide detailed descriptions of the theory and design of N-path polyphase IIR filters, including algorithms for computing the required allpass filter coefficients. The computed coefficients are necessarily quantized to a finite number of bits in an actual implementation. Quantization by rounding or truncation may result in significant filter performance degradation (e.g., larger pass band ripple and smaller stop band attenuation). To find the best performance, given a C coefficients and B bits resolution in the quantized values, it may be necessary to evaluate all 2*B*C possible filters. Evaluation of each filter may require analyzing multiple filter responses in the pass and stop bands, and thus may quickly become computationally impractical (e.g., for an 8-bit quantization and six coefficients, there are over 1014 possible filters.)

[1] Miroslav D. Lutovac and Ljiljana D. Milic, "DESIGN OF HIGH-SPEED IIR FILTERS BASED ON ELLIPTIC MINIMAL Q-FACTORS PROTOTYPE", Conference ETRAN 2002, Banja Vrucica, June 2002.
[2] Artur Krukowski and Izzet Kale, "DSP System Design—Complexity Reduced IIR filter Implementation for Practical Applications", Kluwer Academic Publishers, 2003.

Conventional techniques for optimizing quantized filter coefficients include "bit-flipping" and the "Downhill Simplex Method." (See, e.g., Chapter 3 of Krukowski and Kale). Such techniques have not been found efficient. Differential evolution (DE) is a genetic algorithm that performs direct search minimization. Storn[3] describes DE in the context of digital filter design. However, Stom does not address the handling of candidate coefficient sets with poles outside of the unit circle.

[3] Rainer Stom, "Designing Nonstandard Filters with Differential Evolution", IEEE SIGNAL PROCESSING MAGAZINE, Jan. 2005

In a digital filter, a pole outside of the unit circle may cause a filter to be unstable. To discard candidate coefficient sets that have poles outside the unit circle slows down the convergence of the DE algorithm. According to the present invention, these candidate coefficient sets are scaled by $1/\mu$ times the maximum magnitude of the coefficients in that set, where $\mu$ is a number greater than 1.0. The present invention also takes advantage of the structure of the M-path polyphase decimator, which ensures that minimizing the maximum stop band magnitude response also minimizes the pass band ripple. The metric is defined as the maximum stop band magnitude response.

The MATLAB code set forth in Appendix A defines the function "NthPathNthBand_DE" which takes as inputs the values (a) "nPaths", representing the number of paths; (b) "nc", representing the number of sections in each path (hence, the number of coefficients); (c) "B", the coefficient bit quantization; (d) "NP", the number of points to use in the DE algorithm; (e) "fp", the pass band frequency relative to sampling frequency $F_s$; (f) "fsb", the stopband frequency relative to $F_s$; and (g) "passes", the number of iterations for the DE algorithm. The "NthPathNthBand_DE" function output (a) "beta", which are filter coefficients arranged in an "nPaths" by "nc" array, with $i^{th}$ each row corresponding to $i^{th}$ path; (b) "mpr", the maximum pass band ripple (in dB); "msa", the minimum stop band attenuation (in dB) and "pgdv", the pass band group delay variation (in samples). Appendix B provides an example of an output filter design.

Initially, the DE algorithm randomly selects "NP" sets of B-bit coefficients, $P_{old}$. A metric is selected, which may be, for example, the maximum stop band magnitude response. This metric is computed for each of the "NP" coefficient sets. The number identifying the set with the smallest metric is stored in "bestk" and the smallest metric value is stored in "best". The DE algorithm proceeds for "Passes" iterations. During each iteration, new sets $P_{new}$ of coefficients are initialized to the values of the old set $P_{old}$. For each of the "NP" coefficient sets, a candidate replacement set is obtained by randomly selecting a three of the existing coefficient sets (say, set numbers "rp(1)", "rp(2)", and "rp(3)" respectively) and computing the values of set rp(1) minus 0.85 times the values of the differences between set rp(2) and set rp(3), rounded to a "B" bit quantization. If the maximum magnitude of the coefficients in the candidate set exceeds 1.0, then the candidate set is scaled by dividing by 1.1 times that maximum magnitude, and rounded to "B" bit quantization. The candidate coefficient set replaces an existing coefficient set, if the metric of the candidate set (e.g., the maximum stop band magnitude response) is less than the metric of the existing set. After the final iteration, "beta" is set equal to the surviving coefficient set with the best metric. While the value 0.85 is selected for providing good performance, any positive number less than 1.0 may be used. Similarly, while the value 1.1 provides good performance, any value greater than 1.0 may also be used.

The MATLAB output in Appendix B is for a 3-path, decimate-by-3 decimator with 4 sections (coefficients) per path (i.e., a total of 12 coefficients). The input parameters were 8-bit coefficient quantization, pass band of 0 to $0.1F_s$, stopband of $0.2F_s$ to 0.333Fs, 100 coefficient-point sets, and 1,000 iterations. The program required 35 seconds to run on a 3.6 GHz workstation. The transfer functions for the 12 real sections, 4 per path, are shown in both decimal fraction and hexadecimal fraction notations. The quantized coefficient decimator has maximum pass band ripple of less than $10^{-4}$ dB, minimum stop band attenuation of −48 dB, and maximum pass band group delay variation of 4.5 samples.

Thus, the present invention has been described in the context of minimizing pass band ripple while simultaneously maximizing stop band attenuation. The present invention can also provide filters with other metrics (e.g., cost functions, such as those that match arbitrary amplitude, phase, or group delay curves to frequency, or that match constrains in two or more of amplitude, phase, and group delay).

In this detailed description, the algorithms discussed carry out steps that may involve calculating, comparing, displaying or otherwise manipulating values representing physical quantities, such as electrical signals, in memory, a storage device or a display device of a computer system or another electronic computing device. The above detailed description is provided to illustrate specific embodiments of the present invention and is not intended to be limiting. Numerous variations and modifications within the scope of the present invention are possible. The present invention is set forth in the following claims.

Figure 6:
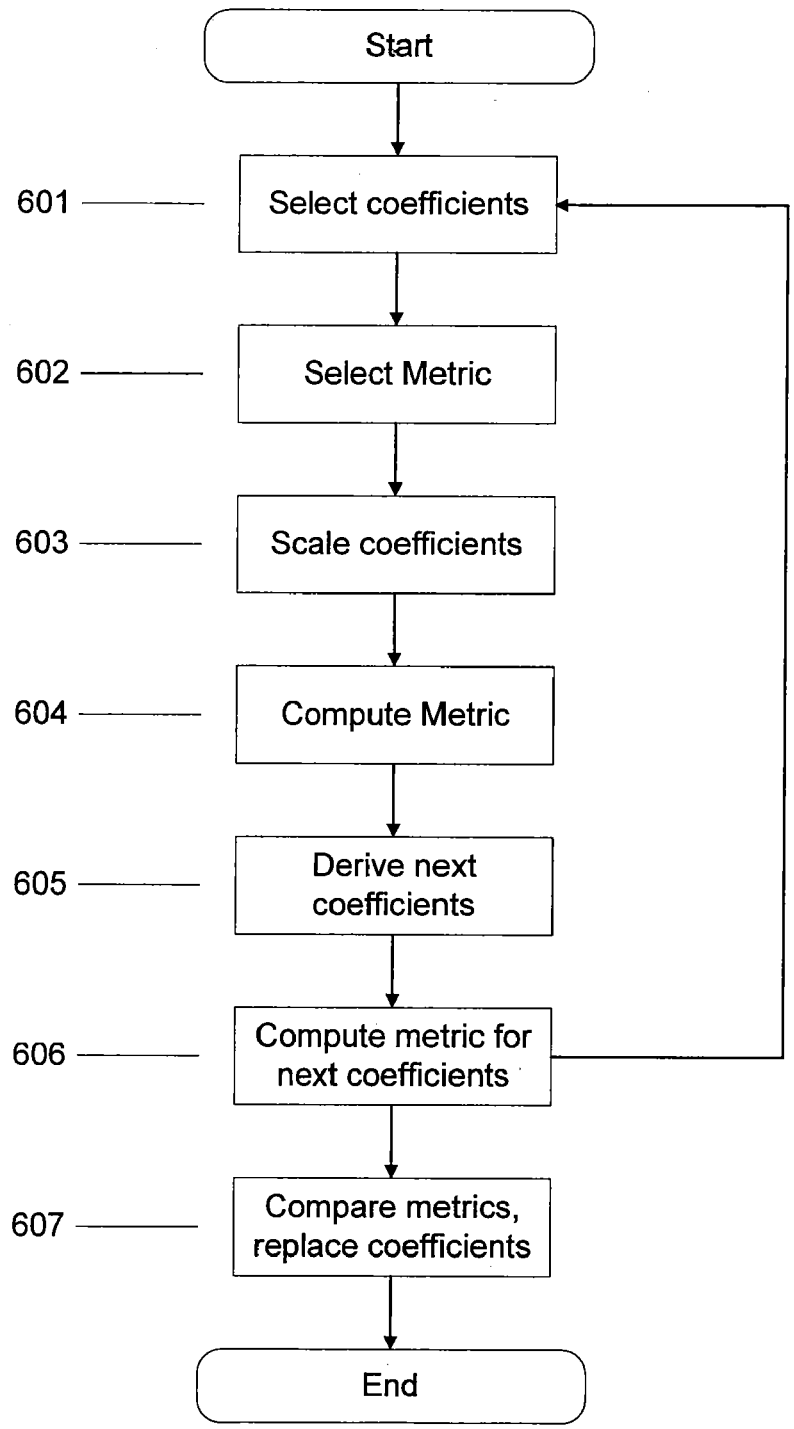
FIG. 6 shows one embodiment of a method for designing a digital filter.

FIG. 6 depicts one embodiment of the present disclosure. Box 601 discloses selecting a predetermined number of current sets of coefficients. Box 602 discloses selecting a metric for evaluating coefficients of the digital filter. Box 603 discloses scaling the selected current sets of coefficients by a function of the current sets of coefficients. Box 604 discloses deriving a next set of coefficients based on a subset of the scaled current set of coefficients. Box 605 discloses computing the metric for the next set of coefficients. Boxes 601, 602, 603, 604 and 605 are iterated until a termination criterion is met. Further, Box 606 discloses comparing the computed metrics and replacing the current set of coefficients with the next set of coefficients if a condition is satisfied. For instance, the current set of coefficients are replaced with the next set of coefficients if the computed metric for the respective next set of coefficients is less than the computed metric for the respective current set of coefficients.

I claim:
1. A method, implemented in an electronic computing device, for designing a digital filter, comprising:

(a) selecting a predetermined number of current sets of coefficients for the digital filter;
(b) selecting a metric for evaluating coefficients of the digital filter;
(c) scaling the selected current sets of coefficients by a function of the current sets of coefficients;
(d) computing a metric for each of the scaled current set of coefficients;
(e) deriving a next set of coefficients based on a subset of the scaled current set of coefficients;
(f) computing the metric for the next set of coefficients;
(g) replacing a selected one of the current set of coefficients based on comparing the metric for the next set of coefficients with the metric for the selected current set of coefficients; and
(h) iterating steps (a) to (f) until a termination criterion is met.

2. A method as in claim 1, wherein the selected metric represents a desired stop band response.

3. A method as in claim 1, wherein the next set of coefficients is derived by adjusting a first one of the current set of coefficients by a weighted difference between a second one of the current set of coefficients and a third one of the current set of coefficients.

4. A method as in claim 3, wherein the weighted difference is obtained by multiplying a predetermined factor to the difference between the second one of the current set of coefficients and the third one of the current set of coefficients.

5. A method as in claim 4, wherein the predetermined factor is less than 1.0.

6. A method as in claim 3, further comprising scaling the next set of coefficients each by a function of a maximum magnitude of the current set of coefficients.

7. A method as in claim 3, wherein the function is selected such that none of the next set of coefficients exceeds 1.0 after the scaling.

8. A method as in claim 1, wherein the precision of the current sets of coefficients and of the next set of coefficients is limited by a predetermined number of bits.

9. A method as in claim 1, wherein the digital filter comprises a N-path, polyphase IIR decimation filter.

10. A method as in claim 1, wherein the replacing comprises:
comparing the metric for the next set of coefficients with the metric for a selected one of the current set of coefficients; and
replacing the selected one of the current set of coefficients with the next set of coefficients if the metric for the next set of coefficients is less than the metric for the selected one of the current sets.

11. A method, implemented in a electronic computing device, for designing a digital filter, comprising:
(a selecting a predetermined number of current sets of coefficients for the digital filter;
(b) selecting a metric for evaluating coefficients of the digital filter;
(c) scaling the selected current sets of coefficients by a function of the current sets of coefficients;
(d) computing a metric for each the scaled current set of coefficients;
(e) deriving a next set of coefficients based on a subset of the scaled current set of coefficients;
(f) computing the metric for the next set of coefficients;
(g) for each of the current set of coefficients, comparing the computed metric for the respective current set of coefficients with the computed metric for the next set of coefficients and replacing the respective current set of coefficients with the next set of coefficients if the metric for the next set of coefficients is less than the metric for the respective current set of coefficients; and
(h) iterating steps (a) to (f) until a termination criterion is met.

12. A method as in claim 11, wherein the deriving comprises:
adjusting a first one of the current set of coefficients by a weighted difference between a second one of the current set of coefficients and a third one of the current set of coefficients.

13. A method as in claim 12, wherein the weighted difference is obtained by multiplying a predetermined factor to the difference between the second one of the current set of coefficients and the third one of the current set of coefficients.

14. A method as in claim 11, further comprising scaling the next set of coefficients each by a function of a maximum magnitude of the current set of coefficients.

15. A method as in claim 14, wherein the function is selected such that none of the next set of coefficients exceeds 1.0 after the scaling.

16. A method, implemented in a electronic computing device, for designing a digital filter, comprising:
(a) selecting a predetermined number of current sets of coefficients for the digital filter;
(b) selecting a metric for evaluating coefficients of the digital filter;
(c) scaling the selected current sets of coefficients by a function of the current sets of coefficients;
(d) computing a metric for each scaled current set of coefficients;
(e) deriving a next set of coefficients based on a subset of the scaled current set of coefficients;
(f) computing the metric for the next set of coefficients;
(g) comparing the computed metric for the respective current set of coefficients with the computed metric for the next set of coefficients;
(h) replacing the respective current set of coefficients with the next set of coefficients if the metric for the next set of coefficients is less than the metric for the respective current set of coefficients; and
(i) iterating steps (a) to (f) until a termination criterion is met.

17. A method as in claim 16, wherein the deriving comprises:
adjusting a first one of the current set of coefficients by a weighted difference between a second one of the current set of coefficients and a third one of the current set of coefficients.

18. A method as in claim 17, wherein the weighted difference is obtained by multiplying a predetermined factor to the difference between the second one of the current set of coefficients and the third one of the current set of coefficients.

19. A method as in claim 16, further comprising scaling the next set of coefficients, each by a function of a maximum magnitude of the current set of coefficients, if the maximum magnitude of the next set of coefficients exceeds a predetermined threshold.

20. A method as in claim 16, wherein digital filter comprises a N-path, polyphase IIR decimation filter.

21. A system for designing a digital filter, comprising:
(a) means for selecting a set of current coefficients;
(b) means for selecting a metric for evaluating the set of current coefficients;
(c) means for scaling the set of current coefficients by a function of the set of current coefficients;

(d) means for computing a metric for each of the scaled coefficients in the set of current coefficients;
(e) means for deriving a set of next coefficients based on a subset of the scaled set of current coefficients;
(f) means for computing a metric for the set of next coefficients;
(g) means for comparing the computed metric for the respective set of current coefficients with the computed metric for the respective set of next coefficients;
(h) means for replacing the respective set of current coefficients with the respective set of next coefficients if the computed metric for the respective set of next coefficients is less than the computed metric for the respective set of current coefficients; and
(i) means for iterating steps (a) to (f) until a termination criterion is met.

22. The system as in claim 21, wherein the digital filter comprises a N-path, polyphase IIR decimation filter.

23. The system as in claim 21, wherein the function in the means for scaling the set of current coefficients is a maximum magnitude of the set of current coefficients.

24. The system as in claim 21, wherein the function in the means for scaling the set of current coefficients is selected such that none of the set of next coefficients exceeds 1.0 after the scaling.

25. The system as in claim 21, wherein the metric in the means for selecting a metric represents a desired stop band response.

* * * * *